United States Patent [19]

Zhu et al.

[11] Patent Number: 5,541,764
[45] Date of Patent: Jul. 30, 1996

[54] CERIUM DOPED BARIUM TITANATE SINGLE CRYSTAL, THE PROCESS THEREFOR AND PHOTOREFRACTIVE DEVICE THEREBY

[75] Inventors: Yong Zhu; Mengjun Hui; Xing Wu; Changxi Yang; Changqing Wang; Hongbin Liu; Xiaojuan Niu; Yingping Chen; Jinfeng Zhang; Tang Zhou, all of Beijing, China

[73] Assignee: Chinese Academy of Sciences Institute of Physics, Beijing, China

[21] Appl. No.: 174,446

[22] Filed: Dec. 28, 1993

[30] Foreign Application Priority Data

Apr. 19, 1993 [CN] China .................. 93104553.3

[51] Int. Cl.⁶ .................................................. G02F 1/35
[52] U.S. Cl. .................................................. 359/326
[58] Field of Search .................. 385/122; 372/21, 372/22; 359/326–332

[56] References Cited

U.S. PATENT DOCUMENTS

| | | | |
|---|---|---|---|
| 3,462,378 | 8/1969 | Remeika | 252/62.9 |
| 3,677,718 | 7/1972 | Lawless | 117/78 |
| 5,057,478 | 10/1991 | Abe et al. | 502/159 |
| 5,170,268 | 12/1992 | Ewbank et al. | 359/7 |

FOREIGN PATENT DOCUMENTS

WO87/07655  12/1987  WIPO .

OTHER PUBLICATIONS

Guruswamy et al, "Self–Pumped Phase Conjugation In BaTiO3:Ce", Organization of O.S.A. Photonic Science Topical Meeting Series, vol. 14, pp. 420–422, Jul. 1991.

"Theoretical active impurity levels of iron, chromium, and managanese for photorefractive effects in barium titanate", P. Moretti, et al., J. Opt. Soc. Am. B, vol. 5, No. 8/Aug. 1988, pp. 1697–1701.

"High beam–coupling gain and deep– and shallow–trap effects in cobalt–doped barium titante, $BaTiO_3$:Co," M. H. Garrett, et al, J. Opt. Soc. Am. B, vol. 9, No. 8/Aug. 1992, pp. 1407–1415.

"Effect of Iron On The Photorefractive Properties of $BaTiO_3$ Single Crystals," G. Godefroy, et al., 1986 (no month), 4 p. (Journal not named).

"Optical and Electrical Properties of Nb Doped $BaTio_3$ Single Crystals Grown by the KF Flux Or The Pulling Method," P. Moretti, et al., Ferroelectrics, 1981, vol. 37, pp. 721–724 (no month).

Primary Examiner—John D. Lee
Attorney, Agent, or Firm—Wigman, Cohen, Leitner & Myers, P.C.

[57] ABSTRACT

The present invention relates to a doped barium titanate single crystal containing barium titanate as substrate and 5–250 ppm Ce, the process therefor and photorefractive devices made from the cerium doped barium titanate single crystal.

2 Claims, 2 Drawing Sheets

CERIUM DOPED BARIUM TITANATE SINGLE CRYSTAL, THE PROCESS THEREFOR AND PHOTOREFRACTIVE DEVICE THEREBY

FIELD OF THE INVENTION

The present invention relates to a kind of cerium doped barium titanate single crystals, the process therefor and photorefractive devices made from the cerium doped barium titanate single crystals.

BACKGROUND OF THE INVENTION

A photorefractive device is a non-linear optical device made in accordance with the photorefractive effect of a crystal(s), which can be a one piece crystal processed according to a certain manner or an optoelectronic system including at least a one piece crystal. The principle and structure of the photorefractive device can be found in various literature, books and proceedings of related symposia. For example, "The photorefractive materials and their application" edited by P. Gunter et al, Spinger-Verlay, published in 1988–1989, and the proceedings on the first three international conferences "On Photorefractive Material, Effect and Devices" in 1988, 1990 and 1991 respectively. This type of device has significant applications in interferometry, phase locking of laser diodes, holography storage, optical image processing, amplification of weak optical image signals, massively interconnected neural-network architecture in optical computing and other new technologies.

Ferroelectric oxide crystals are the most important kind of photorefractive materials. Among them, the tetragonal phase barium titanate crystals are the crystals which have been studied most. The reasons are as follows: firstly, barium titanate crystal possesses excellent photorefractive property and large photorefractive effect; secondly, barium titanate crystal is a single compound. Therefore, it has good optical quality, which is important in the application of optical image processing, amplification of weak optical image signals, holography, massively interconnection of neural-networks, etc. However, undoped barium titanate crystal still has some deficiency, such as longer self-pumped phase conjugation buildup time, longer two wave coupling response time, more strict requirements on the angle and point of incidence. Therefore, it is not easy to adjust them to their optimum values.

The photorefractive property can be improved by doping a little amount of some elements into a pure barium titanate crystal as impurities. It has been reported in the literature that the addition of Fe, Co, Ni, Nb as the impurity elements into a pure barium titanate crystal can change the photorefractive effects of barium titanate crystals. However, the deficiency of undoped barium titanate crystals mentioned above has still not been totally overcome.

OBJECT OF THE INVENTION

One object of the present invention is to overcome the deficiency of the prior art and to provide a crystal material with good optical quality and photorefractive properties suitable for making photorefractive devices.

Another object of the present invention is to provide photorefractive devices made from said crystal material.

A further object of the present invention is to provide a method for preparing said crystal material.

SUMMARY OF THE INVENTION

The present invention provides a kind of cerium doped barium titanate single crystal, which contains barium titanate as the substrate and 5–250 ppm cerium (Ce) based on the amount of the substrate barium titanate. And such cerium doped barium titanate single crystal may further contain 10–50,000 ppm Strontium(Sr).

The present invention also provides photorefractive devices made from the cerium doped barium titanate single crystal of the present invention, and the cerium doped barium titanate single crystal used has been subjected to annealing, oriented cutting, grinding, polishing and poling processes.

According to the present invention, the process for preparing the cerium doped barium titanate single crystal includes the following steps:

(1). sintering BaO and $TiO_2$ or any other raw materials, from which BaO and $TiO_2$ could be formed on sintering, at about 1300° C. for about 12 to about 24 hours to form $BaTiO_3$ powder;

(2). mixing the $BaTiO_3$ powder formed in step (1) with additional $TiO_2$ to form the starting material, wherein the molar ratio of the components being $BaO:TiO_2=$ 33.5–35.5%: 66.5–64.5% and adding 5 to 250 ppm of $CeO_2$ to the mixture;

(3). placing the starting material made in step (2) into a platinum crucible;

(4). heating the starting material in the platinum crucible slowly to a temperature in the range of about 1430° C. to about 1460° C. to melt it, and keeping the melt at a temperature in the range of about 1480° C. to about 1520° C. for about 24 to about 72 hours;

(5). cooling the temperature to the crystallization temperature and seeding a seed with a direction of [100] or [001] or [110] onto the melt surface, and rotating the seed with a rotation rate in the range of about 2 to about 20 rpm.; pulling up the crystal from the melt at a rate in the range of about 0.5 to about 2 mm per hour during the growth of crystal and cooling the temperature at a rate in the range of about 0.3° to about 1° C. per hour at the same time;

(6). pulling up the crystal quickly from the melt to separate them when the crystal has grown to desired size, cooling the temperature to room temperature at a rate in the range of about 15° to about 50° C. per hour to obtain the cerium doped barium titanate single crystal.

DETAILED DESCRIPTION OF THE INVENTION

Figure 1:
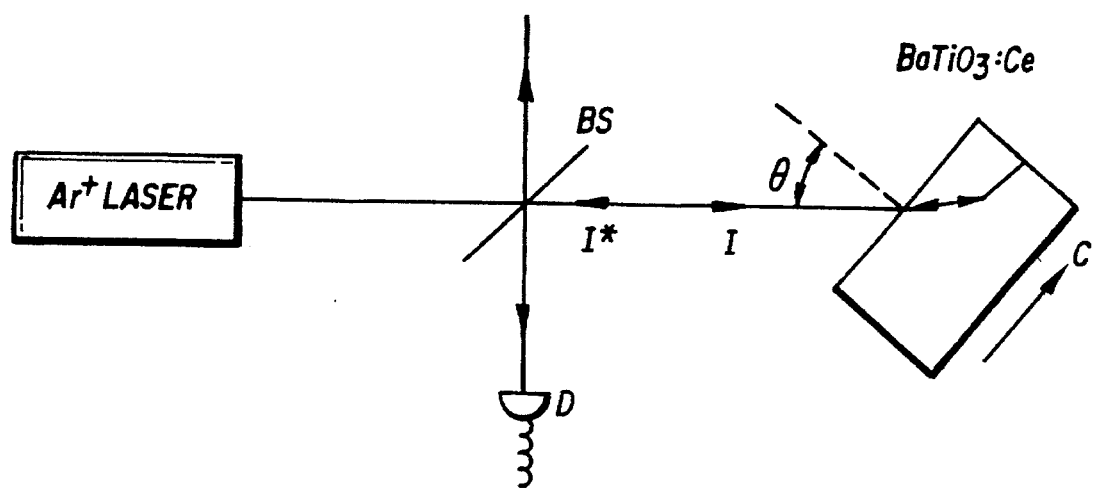
FIG. 1 is the schematic drawing for determining the self-pumped phase conjugation reflectivity of the cerium doped barium titanate single crystal according to the present invention.

The present invention provides a kind of cerium doped barium single crystal, containing barium titanate as the substrate and 5–250 ppm cerium (Ce) based on the amount of substrate barium titanate.

According to the present invention, the cerium doped barium titanate single crystal may further contain 10–50,000 ppm Strontium(Sr).

The present invention also provides photorefractive devices made from the cerium doped barium titanate single crystal of the present invention, and the cerium doped barium titanate single crystal used has been subjected to annealing, oriented cutting, grinding, polishing and poling processes.

The inventors of the present invention found that the cerium doped barium titanate single crystal of the present invention possesses better photorefractive properties than a cerium undoped barium titanate single crystal. The output of self-pumped phase conjugation light can be accomplished in the whole wavelength range of 480 to 800 nm. The self-pumped phase conjugation (SPPC) reflectivity is up to 60% (without reflectivity correction) when an argon ion laser beam with a wavelength of 514.5 nm enters the self-pumped phase conjugation devices made from the crystals of the present invention.

For the photorefractive devices made from the cerium doped barium titanate single crystal of the present invention, the mechanism for producing a conjugation beam is different from what is observed in the traditional "cat" mirror in photorefractive devices made from an undoped barium titanate single crystal. It is caused by backward stimulated photorefractive scattering. It has a bigger backward gain factor and low threshold for producing phase conjugation. The device has a series of advantages such as wide incident angle ($0°<\theta<80°$), wide range of incident position and easy adjustment. With the two wave coupling amplifier made from the crystals of the present invention, the two wave mixing coupling coefficient is over 25 cm$^{-1}$ when the incident beam diameter is 1 mm, the beam source is 514.5 nm argon ion laser, the power density of the pumped beam is 20 mW/cm$^2$ and the light intensity ratio of the signal to the pumped beam is 1:10,000.

According to the present invention, the process for preparing the cerium doped barium titanate single crystal comprises the following steps:

(1). sintering BaO and TiO$_2$ or any other raw material, from which BaO and TiO$_2$ can be formed on sintering, at about 1300° C. for about 12 to about 24 hours to form BaTiO$_3$ powder;

(2). mixing the BaTiO$_3$ powder formed in step (1) with additional TiO$_2$ to form starting material, wherein the molar ratio of the components are BaO:TiO$_2$= 33.5–35.5%:66.5–64.5% and adding 5–250 ppm of CeO$_2$ to the mixture;

(3). placing the starting material made in step (2) into a platinum crucible;

(4). heating the starting material in the platinum crucible slowly to a temperature in the range of about 1430° C. to about 1460° C. to melt it, and keeping the melt at a temperature in the range of about 1480° C. to about 1520° C. for about 24 to about 72 hours;

(5). cooling the temperature to the crystallization temperature and seeding a seed with a direction of [100] or [001] or [110] onto the melt surface, and rotating the seed with a rotation rate in the range of about 2 to about 20 rpm.; pulling up the crystal from the melt at a rate in the range of about 0.5 to about 2 mm per hour during the growth of crystal and cooling to the temperature at a rate in the range of about 0.3° to about 1° C. per hour at the same time;

(6). pulling up the crystal quickly from the melt to separate them when the crystal has grown to desired size, cooling the temperature to room temperature at a rate in the range of about 15° C. to about 50° C. per hour to obtain a cerium doped barium titanate single crystal.

According to the process of the present invention, the top-seeded solution growth (TSSG) technique is adopted for the crystal growth. All the feeds used in the present invention have a purity of 99.99%. By adopting the process of the present invention, an integrated single crystal with 45 mm in diameter, 20 mm in length and about 200 g in weight can be obtained, from which more than ten rectangular single crystals in the size of larger than 5×5×5 mm$^3$ could be obtained via cutting.

The color of a single crystal made by the TSSG technique would fade after annealing according to the process of the present invention.

The cerium doped barium titanate single crystal made in accordance with the process of the present invention can be processed in a convenient method, for example processed according to the following steps:

The oriented cutting and grinding of the crystals:
  After X-ray diffraction orientation, the obtained crystals are cut into rectangles of desired size, therefore, the three pairs of planes are perpendicular to the three main crystallographic axes of the crystals and the six planes are ground with 7 μm aluminum oxide powder;

The annealing of the crystals:
  The oriented cut and ground crystal rectangles are annealed under an oxidizing or reducing atmosphere at a temperature in the range of about 500° to about 1100° C. while the temperature rate of change between room temperature and 300° C. is 1° C. per 5 minutes;

The polishing of the crystals:
  After annealing, the crystals are polished with ferric oxide powder having a particle size less than 1 μm;

The poling of the crystals:
  The polished crystals are subjected to alternative uniform pressure along two different a-axis for eliminating the 90° domain existing within the crystals; the crystals which have a substantially eliminated 90° domain are heated and applied a direct current field to remove the 180° domain, namely, painting the two (001) planes of the crystals with silver and then immersing them into silicon oil, heating them slowly at a speed of 0.5° C. per minute until the temperature is about 1° to about 10° C. below the Curie point (132° C.+1° C.), applying direct-current field of about 0.5 to about 4 kV/cm and keeping constant temperature and voltage for a few hours, then slowly reducing the temperature to room temperature at the same rate as described above under the unchanged voltage, removing the voltage at last to eliminate the 180° domain and to obtain a single domain crystal.

During the treatment of the cerium doped barium titanate single crystal obtained according to the present invention, the annealing atmosphere can be chosen in accordance with the character of the crystals. The pressure intensity needed for eliminating the 90° domain in crystals depends on the quality of the crystals themselves, their grinding and other factors, but usually not over 200 kg/cm$^2$. After alternatively imposing mechanical pressure along two different a-axis for several times, most of the 90° domain in the crystals can be substantially eliminated. The optimum intensity of an electric field for eliminating the 180° domain changes with the temperature difference between crystals and the Curie point and also depends on the crystal quality.

The crystals which have been subjected to the treatment mentioned above can be used as photorefractive devices or the essential parts of the photorefractive devices. The application method is the same as those devices made from undoped barium titanate crystal devices. When used as self-pumped phase conjugation devices, and when polarized light with a wavelength in the range of about 480 to about 800 nm is used as incident beam, the planes of both incidence and polarization are all parallel to the other a-plane, whenever the incident light comes from any of the a-planes. More than 40% self-pumped phase conjugation reflectivity (without correction) can be pronounced from a wide range of incident angles (the included angles between incident beam and the normal line of the incident plane). The stable strong output of a self-pumped phase conjugation beam can also be obtained in a wide range of incident light position when the incident angle is constant and the position of the incident light is parallel moved along axis C. Besides, the self-pumped phase conjugation buildup time is rather short, only three seconds (measured at $e^{-1}$ position).

The photorefractive devices provided according to the present invention have better performance than the undoped barium titanate devices. They have the advantages of good optical quality, simplified optical processing (only one or two planes need polishing), high finished product rate, convenient to use and easy adjustment etc., which is more practical.

The present invention will be further illustrated referring to the following examples and drawings.

EXAMPLE 1

$BaCO_3$ and $TiO_2$ (both of them had a purity of 99.99%) were kept at 600° C. for 4 hours and at 780° C. for 5 hours respectively for dehydration. Then the thus obtained $BaCO_3$ and $TiO_2$ were put into an aluminum oxide recrystallized mortar at a molar ratio of 35.5% $BaCO_3$ and 64.5% $TiO_2$, and were ground/mixed for one hour, then the mixture was placed into a platinum crucible and was sintered for 15 hours at 1200° C. to form the starting material having a composition of 35.5% (mol) BaO and 64.5% (mol) $TiO_2$. 700 g of the starting material was put into a platinum crucible with a dimension of Ø 80 mm×60 mm and 4.0 mg $CeO_2$ (99.99% in purity) was further added into the platinum crucible without any treatment. After the feed was melted, it was kept at 1480° C. to 1540° C. for 24 hours and cooling the temperature to the crystallization temperature then seeding a seed with an orientation of [100] onto the melt surface. The crystals were grown in the air with a seed rotating rate at 10 rpm. When the crystals had grown up to about 45 mm in diameter, it was pulled up at a rate of 1.2 mm per day; and when a crystal having a length of 20 mm after equal-diameter growth, pulling up the crystal quickly to separate the crystal from the melt surface. Then the crystal was cooled to room-temperature at a rate of 25° C. per hour. The obtained crystals had a dimension of 45 mm×20 mm and a weight of 200 g. It was an integrated single crystal without any cracks. Analysis of the crystal indicated that its Ce content was 9.8 ppm.

The crystal was placed in an annealing furnace and was annealed under atmosphere. The furnace was heated from room temperature to 860° C. in 44 hours, and this temperature was kept for 24 hours and then it was cooled to room temperature in 22 hours. Between room temperature to 300° C., the temperature heating or cooling rate was 1° C. per 5 minutes.

EXAMPLE 2

$BaCO_3$ and $TiO_2$ (both of them had a purity of 99.99%) were kept at 600° C. for 4 hours and at 780° C. for 5 hours respectively, and then they were sintered for dehydration. Then the thus obtained $BaCO_3$ and $TiO_2$ were put into an aluminum oxide recrystallized mortar at a molar ratio of 35.5% $BaCO_3$ and 64.5% $TiO_2$, and were ground/mixed for one hour, then the mixture was placed into a platinum crucible and was sintered for 15 hours at 1200° C. to form the starting material having a composition of 35.5% (mol) BaO and 64.5% (mol) $TiO_2$. 700 g of the starting material was put into a platinum crucible with a dimension of Ø 80 mm×60 mm and 20.2 mg $CeO_2$ (99.99% in purity) was further added into the platinum crucible without any treatment. After the feed was melted, it was kept at 1480° to 1540° C. for 48 hours and cooling the temperature to the crystallization temperature then seeding a seed with an orientation of [100] onto the melt surface. The crystals grown in the air with a seed rotating rate at 15 rpm. When the crystal had grown up to 45 mm in diameter, it was pulled up at a rate of 1.2 mm per day; and when a crystal had a length of 20 mm after equal-diameter growth, pulling up the crystal quickly to separate the crystal from the melt surface, then the crystal was cooled to room temperature at a rate of 45° C. per hour. The obtained crystal had a dimension of Ø 45 mm×20 mm and a weight of 200 g, it was an integrated single crystal without any cracks. Analysis of the crystal indicated that its Ce content was 48 ppm.

The crystal was placed in an annealing furnace and was annealed under an atmosphere. The furnace was heated from room temperature to 860° C. in 44 hours, and this temperature was kept for 24 hours and then it was cooled to room temperature in 22 hours. Between room temperature to 300° C., the temperature heating or cooling rate was 1° C. per 5 minutes.

EXAMPLE 3

The same procedures of Example 1 was carried out except that 500 ppm SrO (99.99% in purity) was added into the barium titanate substrate.

EXAMPLE 4

The same procedures of Example 2 was carried out except that 1500 ppm SrO (99.99% in purity) was added into the barium titanate substrate.

EXAMPLE 5

The crystal obtained from Example 1 (Ce content was 9.8 ppm) was oriented by X-ray diffraction and was then cut into two pieces of rectangular crystals. Each of the three pairs of parallel planes of these two crystals was ground until they were perpendicular to [001] and [100] planes respectively. The accuracy of the direction was less than 30' and the dimensions of the crystals were 8.00×6.95×6.85 $mm^3$ and 5.75×4.48×3.43 $mm^3$ respectively, wherein, the first numbers were the length along C-axis. After being subjected to grinding with 7 μm aluminum oxide powder and then being exposed to 100 $kg/cm^2$ pressure three or four times alternatively along the two different a-axes of the crystals, the 90° domain within the crystals had disappeared. Then, silver was painted onto the pairs of c-planes of the 90° domain-free crystals and the painted crystals were immersed into silicon oil. The temperature of the silicon oil was heated to 130° C. at the rate of 0.4° C. per minute and then 1800 V direct-current voltage was applied to the crystals at this temperature for 6 hours. After that, the temperature was lowered to room temperature at a rate of 0.4° C. per minute, while keeping the voltage unchanged. The voltage was then removed and the crystals were taken out of the silicon oil. After the silver had been removed, the single domain crystals were then obtained.

EXAMPLE 6

The crystal obtained from Example 2 (Ce content was 48 ppm) was oriented by X-ray diffraction and was then cut into one rectangular crystal. The three pairs of parallel planes of the crystal were ground until they were perpendicular to [001], and [100] planes respectively. The accuracy of the direction was less than 30' and the dimensions of the crystal were $6.93 \times 7.02 \times 1.96$ mm$^3$, wherein the first number was the length along the C-axis. After being subjected to grinding with 7 μm aluminum oxide powder and then being exposed to 100 kg/cm$^2$ pressure three or four times alternatively along the two different a-axes of the crystal, the 90° domain within the crystal had disappeared. Then, silver was painted onto the pair of C-planes of the 90° domain-free crystal and the painted crystal was immersed in silicon oil. The temperature of the silicon oil was heated to 130° C. at a rate of 0.4° C. per minute and then 1800 V direct-current voltage was applied to the crystal at this temperature for 6 hours. After that, the temperature was lowered to room temperature at a rate of 0.4° C. per minute, while keeping the voltage unchanged. The voltage was then removed and the crystal was taken out of the silicon oil. After the silver had been removed, the single domain crystal was then obtained.

EXAMPLE 7

Figure 2:
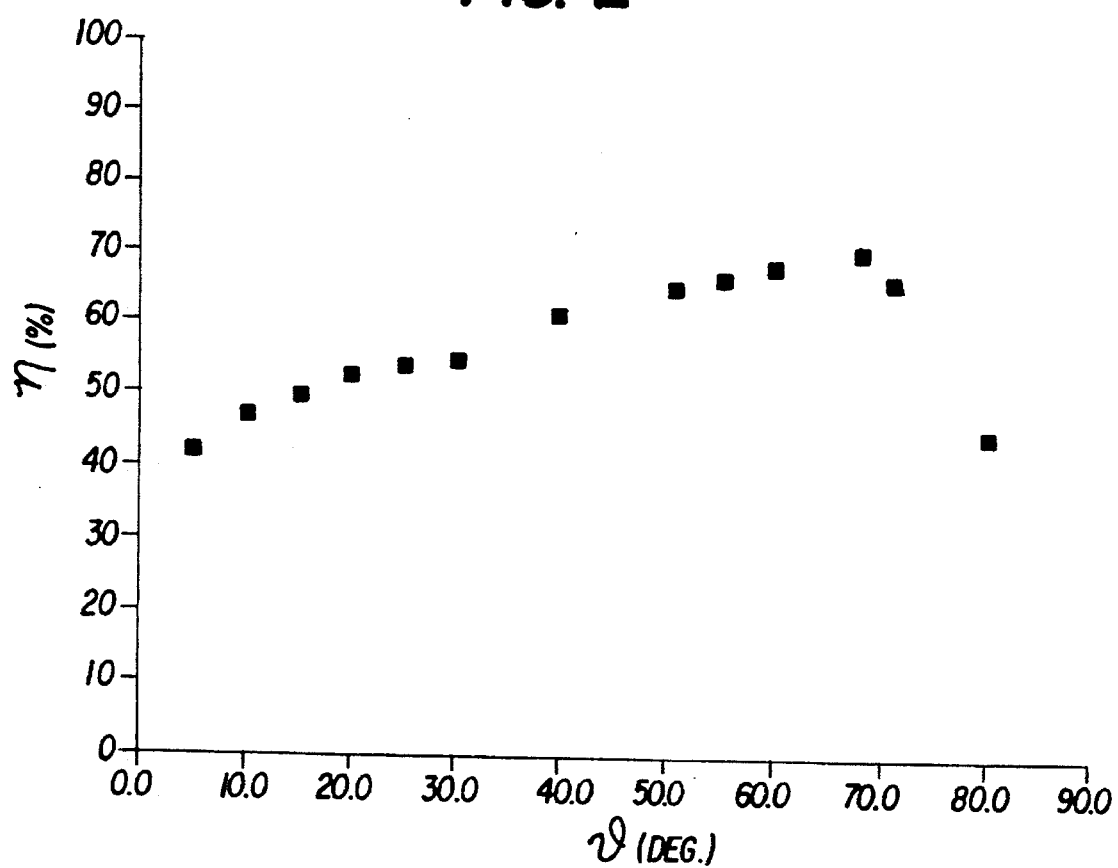
FIG. 2 illustrates the relationship between the incident angle θ of the cerium doped barium titanate single crystal of the present invention and the self-pumped phase conjugation reflectivity η.
Figure 3:
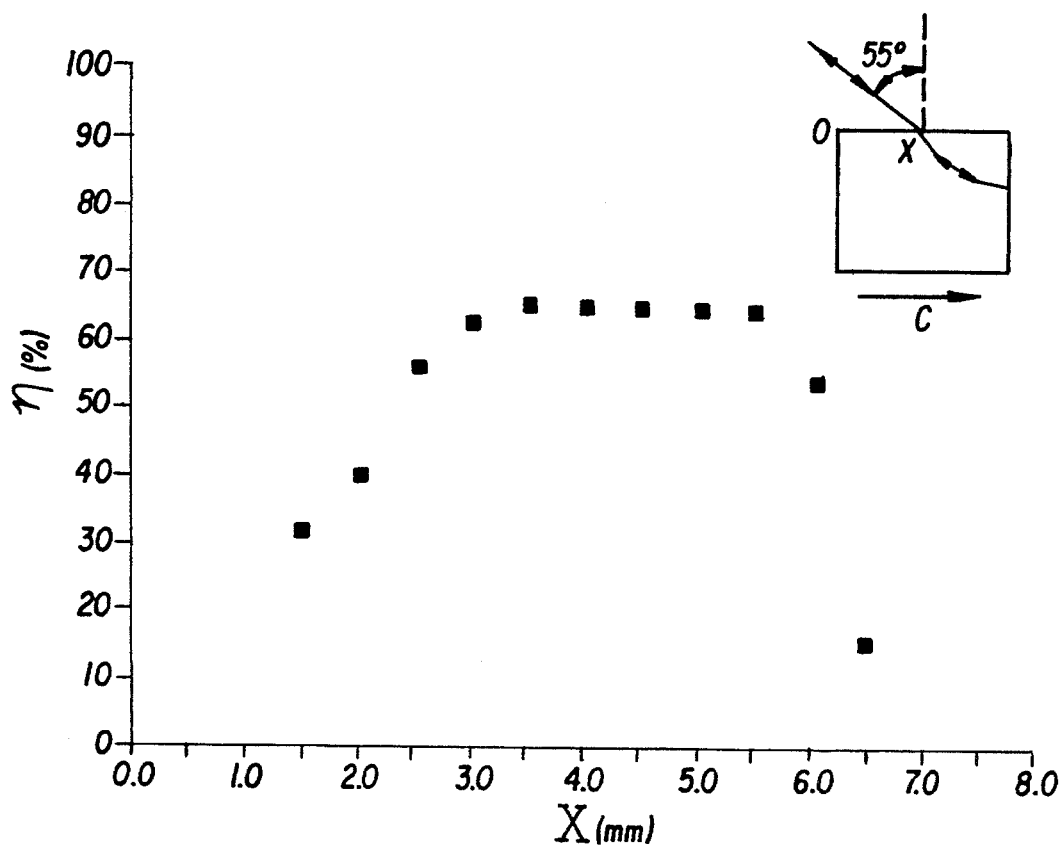
FIG. 3 illustrates the relationship between the incident position X of the cerium doped barium titanate single crystal of the present invention and the self-pumped phase conjugation reflectivity η.

Crystals obtained in Example 1 or 5 were used as photorefractive self-pumped phase conjugation devices as shown in FIG. 1. The beam source was a Model 2016 Argon Ion Laser from Spectra Physics Co. USA; and the output was a 514.5 nm TEM$_{oo}$ continuous e-polarized beam. The light beam, through a beam splitter BS with reflectivity of 50%, was incident on an a-plane of the crystal (the dimension of the crystal was $8.00 \times 6.95 \times 6.85$ mm$^3$ with the C axis parallel to the longest dimension). The power of the incident beam I was 12 mW; the diameter of the beam was 0.6 mm and the incident angle was θ. The self-pumped phase conjugation beam I* formed in the crystal went out along the direction opposite to the incident direction, and finally exited after being reflected by a beam splitter BS. The intensity of the conjugation light was determined by a powermeter D. The relationship between the reflectivity of the self-pumped phase conjugation beam and the incident angle was determined as shown in FIG. 2. The reflectivity can be up to 70% (uncorrected) when the incident angle was 68°; and a reflectivity with a value of more than 50% of the self-pumped phase conjugation wave could always be obtained with the incident angle θ within the range of 20°–70°. The self-pumped phase conjugation buildup time was three seconds (measured at e$^{-1}$ point). It is illustrated in FIG. 3 that more than 50% reflectivity of the self-pumped phase conjugation wave could be obtained when the incident angle was 55°, and the crystal was moved parallel along the C axis (8 mm) and the incident beam entered the crystal from different positions X within the range of 4 mm.

An e-polarized beam, with an incident angle θ=65° and a wave length of 514.5 nm, entered the a-plane (with the area of $5.76 \times 4.48$ mm$^2$) of the crystal, whose dimensions were $5.76 \times 4.48 \times 3.43$ mm$^3$ (C axis parallel to the longest dimension), wherein only one a-plane ($5.76 \times 4.48$ mm$^2$) was polished and the other five planes remained unpolished. When measured by the same method as shown in FIG. 1, the reflectivity (without crystal surface reflection correction) of the self-pumped phase conjugation wave was 61%.

EXAMPLE 8

Figure 4:
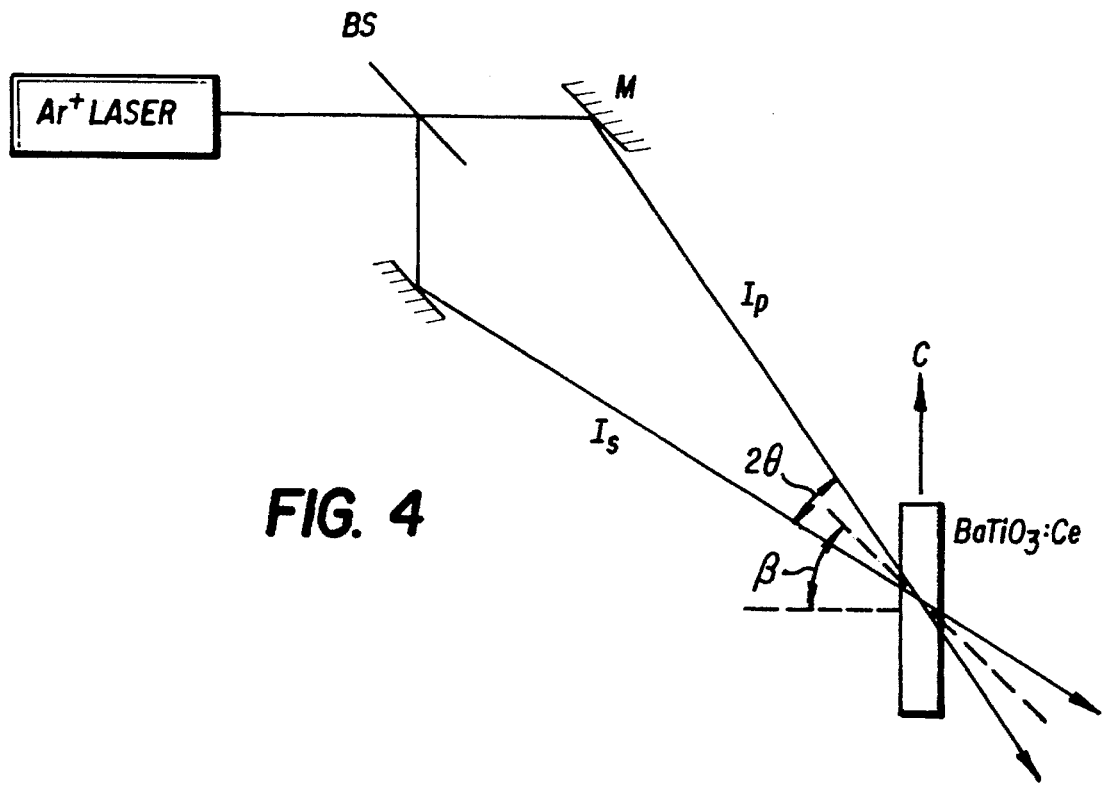
FIG. 4 is the schematic drawing for determining the two wave coupling coefficient of the cerium doped barium titanate single crystal according to the present invention, wherein BS represents the beam splitter and M represents the reflector, 2θ=30°, 2β=40°.

A crystal obtained in Example 2 or 6 with dimensions of $6.93 \times 7.02 \times 1.96$ mm$^3$ (6.96 mm was the length along axis C) is two wave coupling amplification devices as illustrated in FIG. 4. The beam source was a Model 2016 Argon Ion Laser from Spectra Physics Co. USA; and the output was a 514.5 nm TEM$_{oo}$ continuous e-polarized beam. The beam was split to two beams with different intensity through a beam splitter BS. One entered into the crystal as pump beam I$_p$ and the other entered into the crystal as signal beam I$_s$. When the power density of the pump beam was 20 mW/cm$^2$, the intensity ratio of the signal and the pump beam was 1:10,000. The included angle 2θ between the pump beam and signal beam was 30° and the included angle between the equant line of 2θ and the normal line of the a-plane was 45° for the optimum coherent amplification in the crystal, the two wave mixing coupling coefficient is over 25 cm$^{-1}$.

What is claimed is:

1. A cerium doped barium titanate single crystal comprising a barium titanate substrate and 5–250 ppm cerium based on the weight of the barium titanate substrate, wherein said barium titanate substrate further contains 10–50,000 ppm strontium.

2. A photorefractive device comprising means to direct at least one incident beam of light into at least one crystal which changes a spatial distribution of its refractive indices owing to an electro-optical effect and thereby changes one or more of the direction, the intensity, and the phase of the beam of the light, wherein the crystal used is a cerium doped barium titanate single crystal containing a barium titanate substrate and 5–250 ppm cerium based on the weight of the barium titanate substrate, and wherein the barium titanate substrate of the cerium doped barium titanate single crystal further contains 10–50,000 ppm strontium.

* * * * *